(12) United States Patent
Ali et al.

(10) Patent No.: US 7,737,564 B2
(45) Date of Patent: Jun. 15, 2010

(54) POWER CONFIGURATION METHOD FOR STRUCTURED ASICS

(75) Inventors: Anwar Ali, San Jose, CA (US); Tauman T. Lau, San Jose, CA (US); Kalyan Doddapaneni, Sunnyvale, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/334,870

(22) Filed: Jan. 19, 2006

(65) Prior Publication Data

US 2007/0164451 A1 Jul. 19, 2007

(51) Int. Cl.
*H01L 23/48* (2006.01)
(52) U.S. Cl. .................. 257/784; 257/692; 257/781; 257/786; 257/E23.02
(58) Field of Classification Search .......... 257/781–786, 257/691–697, 202, 203, E23.02, E27.11; 438/612–624
See application file for complete search history.

(56) References Cited

U.S. PATENT DOCUMENTS

| | | | | |
|---|---|---|---|---|
| 5,089,881 A * | 2/1992 | Panicker | ..................... | 257/691 |
| 5,172,471 A * | 12/1992 | Huang | ........................ | 29/840 |
| 5,796,170 A * | 8/1998 | Marcantonio | ............... | 257/786 |
| 6,031,258 A * | 2/2000 | Ranjan et al. | ............... | 257/203 |
| 6,410,990 B2 * | 6/2002 | Taylor et al. | ................ | 257/786 |
| 6,593,649 B1 * | 7/2003 | Lin et al. | .................... | 257/697 |
| 6,727,597 B2 * | 4/2004 | Taylor et al. | ................ | 257/786 |
| 6,770,963 B1 * | 8/2004 | Wu | ............. | 257/691 |
| 6,825,108 B2 * | 11/2004 | Khan et al. | ................. | 438/613 |
| 6,989,593 B2 * | 1/2006 | Khan et al. | ................. | 257/707 |
| 7,129,574 B2 * | 10/2006 | Wu | ............. | 257/691 |
| 2001/0013663 A1 * | 8/2001 | Taylor et al. | ................ | 257/786 |
| 2002/0043712 A1 * | 4/2002 | Efland | ........................ | 257/691 |
| 2004/0238939 A1 * | 12/2004 | Wu | ............. | 257/691 |
| 2006/0151851 A1 * | 7/2006 | Pillai et al. | .................. | 257/531 |

\* cited by examiner

*Primary Examiner*—Dung A. Le
(74) *Attorney, Agent, or Firm*—Suiter Swantz pc llo

(57) ABSTRACT

A method for electrically coupling a bond pad of an integrated circuit such as a field programmable device, an application-specific integrated circuit, or a rapid chip with an input/output device is disclosed. The bond pad is provided with a plurality of metal layers configurable for making a connection with the input/output device. The bond pad is then coupled to the input/output device with an interconnect structure. The method for electrically coupling the bond pad to the input/output device allows the customer to configure the power and ground pad counts after the slice is created.

12 Claims, 12 Drawing Sheets

POWER CONFIGURATION METHOD FOR STRUCTURED ASICS

FIELD OF THE INVENTION

The present invention generally relates to the field of integrated circuits, and more particularly to a universal bond pad for coupling an input/output device to an integrated circuit.

BACKGROUND OF THE INVENTION

Typically, integrated circuits such as rapid chips, structured ASICs, or field programmable devices allow chip designers to configure input/output (IO) devices during metallization or programming steps. For wirebond packages, this flexibility is assisted by a system of bond pads and signal fingers that electrically couple IO devices to the package. Each signal finger is hardwired via pad wire to a bond pad of the package. Some of the bond pads are configured for power/ground connections while others are configured for signal IO. Flipchip based designs work in a similar manner except the signal fingers and pad wire are replaced by flipchip bumps.

Power and ground connections for configurable IO devices and the core area have defined ratios and/or counts. The slice designer chooses these counts during the base layer creation of the design. The power/ground pad counts are derived by examining typical applications to make an engineering choice on a fixed number. The counts cannot be configured by the customer. This means that a high speed IO application with low signal count, which demands more IO and power/ground pad counts than is available on the slice, may not be compatible with the package. Conversely, a lower speed IO application, which requires a large signal count but not all power/ground pad counts available on the slice, may not be compatible with the package. Therefore, performance is limited. A similar scenario applies to core power and ground supplies. A small core content may not justify all core power and ground supplies. Conversely, a large core content or speed may demand more power and ground pads which would not be available, thus limiting the chip core performance.

Accordingly, it is desirable to provide a method for configuring the power and ground counts after slice creation to comply with customer requirements.

SUMMARY OF THE INVENTION

The present invention is directed to a method for electrically coupling a bond pad of an integrated circuit such as a field programmable device, an application-specific integrated circuit, or a rapid chip with an input/output device. The bond pad is provided with a plurality of metal layers configurable for making a connection with the input/output device. The bond pad is then coupled to the input/output device with an interconnect structure. The method for electrically coupling the bond pad to the input/output device allows the customer to configure the power and ground pad counts after the slice is created.

In another aspect of the invention, a universal bond pad system for electrically coupling an integrated circuit such as a field programmable device, an application-specific integrated circuit, or a rapid chip to an input/output device is disclosed. The universal bond pad system comprises a plurality of metal layers and an interconnect structure. The plurality of metal layers are configurable for supplying a connection to the input/output device. The interconnect structure electrically couples the plurality of metal layers to the input/output device. The universal bond pad system allows a customer to configure the power and ground pad counts after slice creation.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring to FIGS. 1 through 12, a method and system for electrically coupling a bond pad 100 of an integrated circuit 400 to an input/output device 200 is disclosed. The bond pad 100 is provided with a plurality of metal layers configurable for making a connection with the input/output device 200. An interconnect structure is then coupled to the bond pad 100 and the input/output device 200 for electrically coupling the plurality of metal layers to the input/output device 200. The method and system for electrically coupling the bond pad 100 to the input/output device 200 allows a customer to configure the power and ground pad counts after a slice is created.

Figure 1:
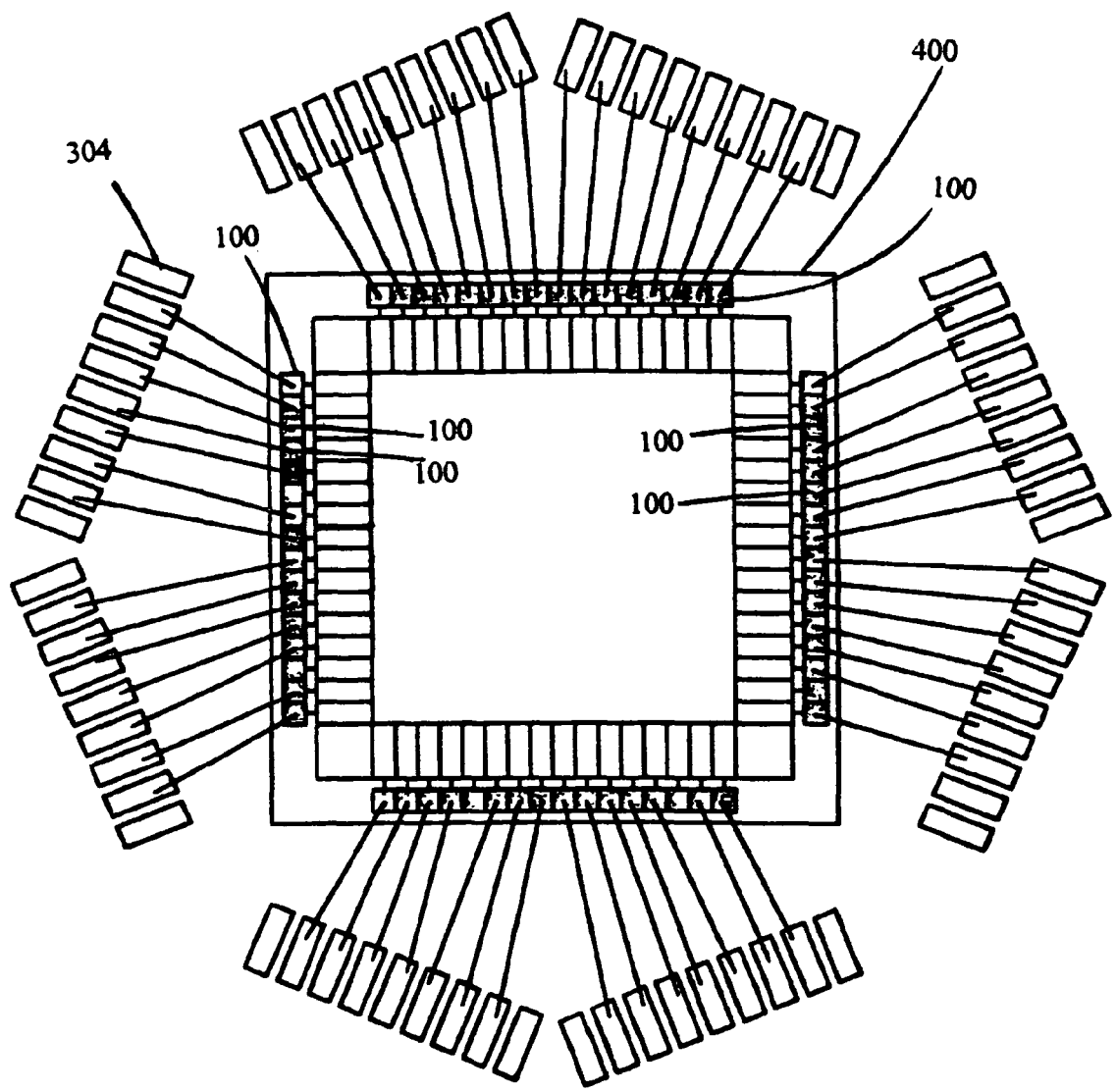
FIG. 1 is a schematic diagram of a wirebond package containing an arrangement of signal fingers which are all configurable for an input/output signal, power, and ground connection in accordance with the present invention.

The integrated circuit 400 is a wirebond field programmable device in the embodiment illustrated in FIG. 1. The integrated circuit 400 may be any one of a variety of integrated circuits such as a rapid chip or an application-specific integrated circuit. The integrated circuit 400 is shown in FIG. 1 including an arrangement of signal fingers 304 coupled to the integrated circuit 400 via a pad wire 300. Each signal finger 304 couples to a power/ground pad connection of the input/output device 200.

A universal bond pad system 100 is illustrated in FIGS. 1 through 11. Each bond pad of the universal bond pad system 100 is comprised of a plurality of metal layers configurable for supplying a connection to the input/output device 200. In the embodiments illustrated, the bond pad is comprised of six layers: a first metal layer 102, a second metal layer 104, a third metal layer 106, a fourth metal layer 108, a fifth metal layer 110, and a sixth metal layer 112. The specific number of metal layers and their sizes are for illustration purposes and can vary. A interconnect structure 300 is employed for electrically coupling the plurality of metal layers to the input/output device 200. The universal bond pad system 100 allows the customer to configure the power and ground pad counts after a slice is created.

Figure 2:
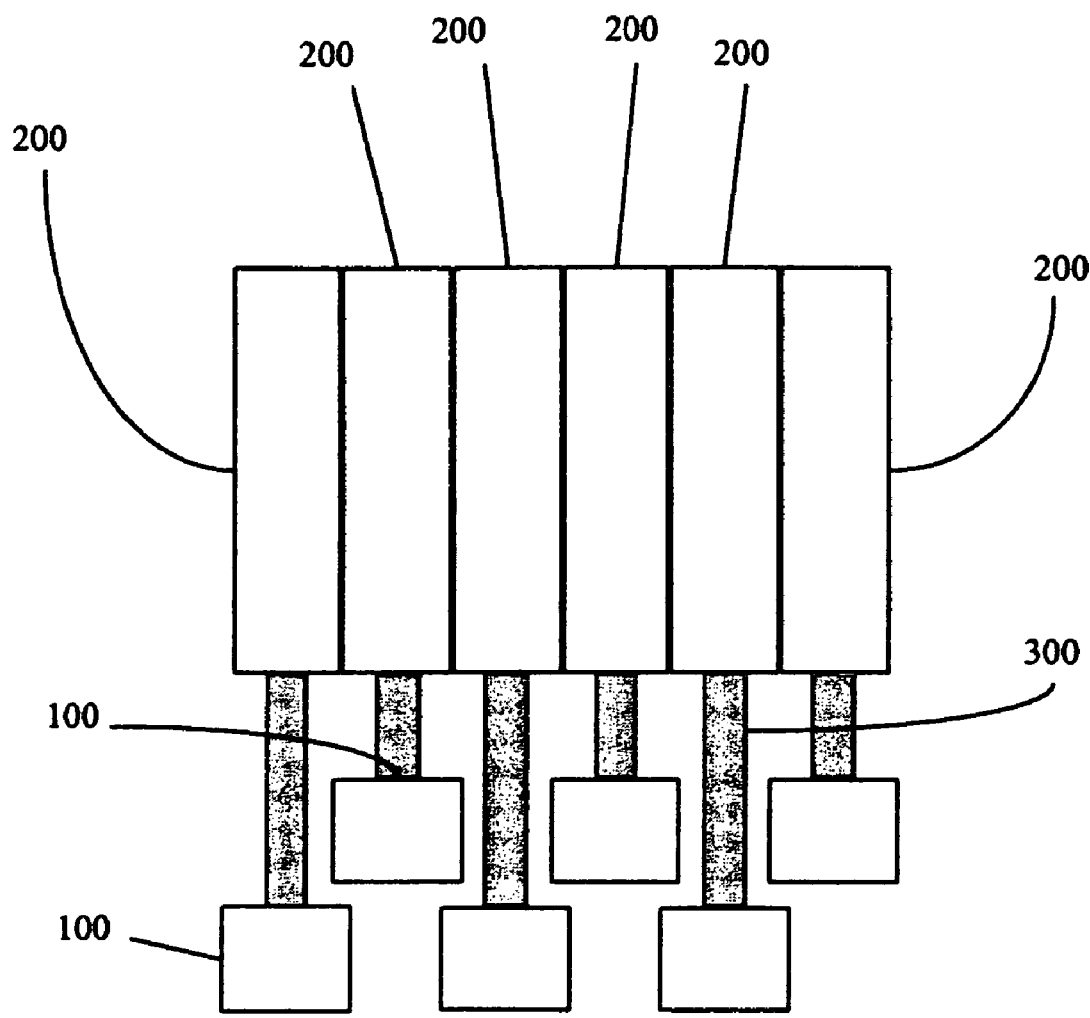
FIG. 2 is a schematic diagram of an arrangement of input/output devices and bond pads configurable for an input/output signal, power, and ground connection in accordance with the present invention.
Figure 3:
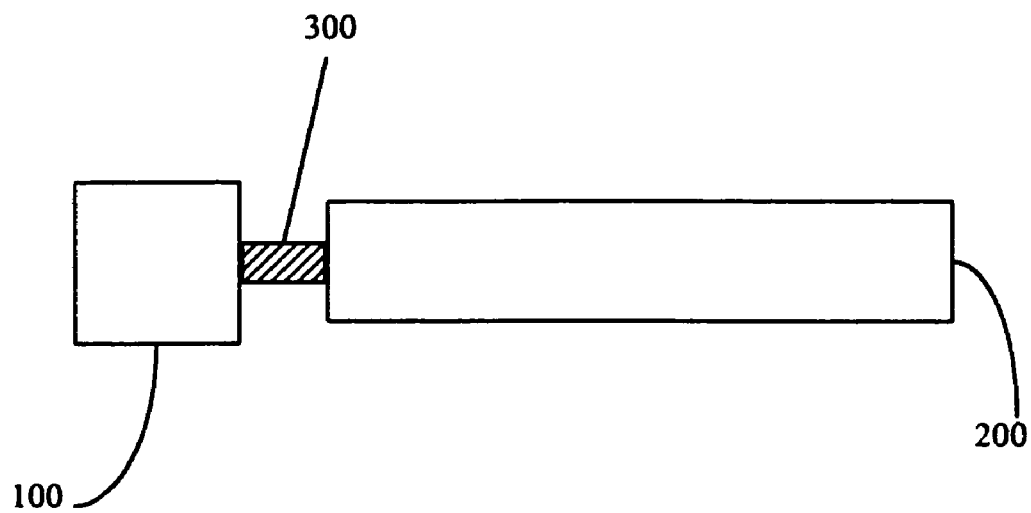
FIG. 3 is an schematic diagram of an overhead view of a bond pad coupled to an input/output device with a pad wire.
Figure 4:
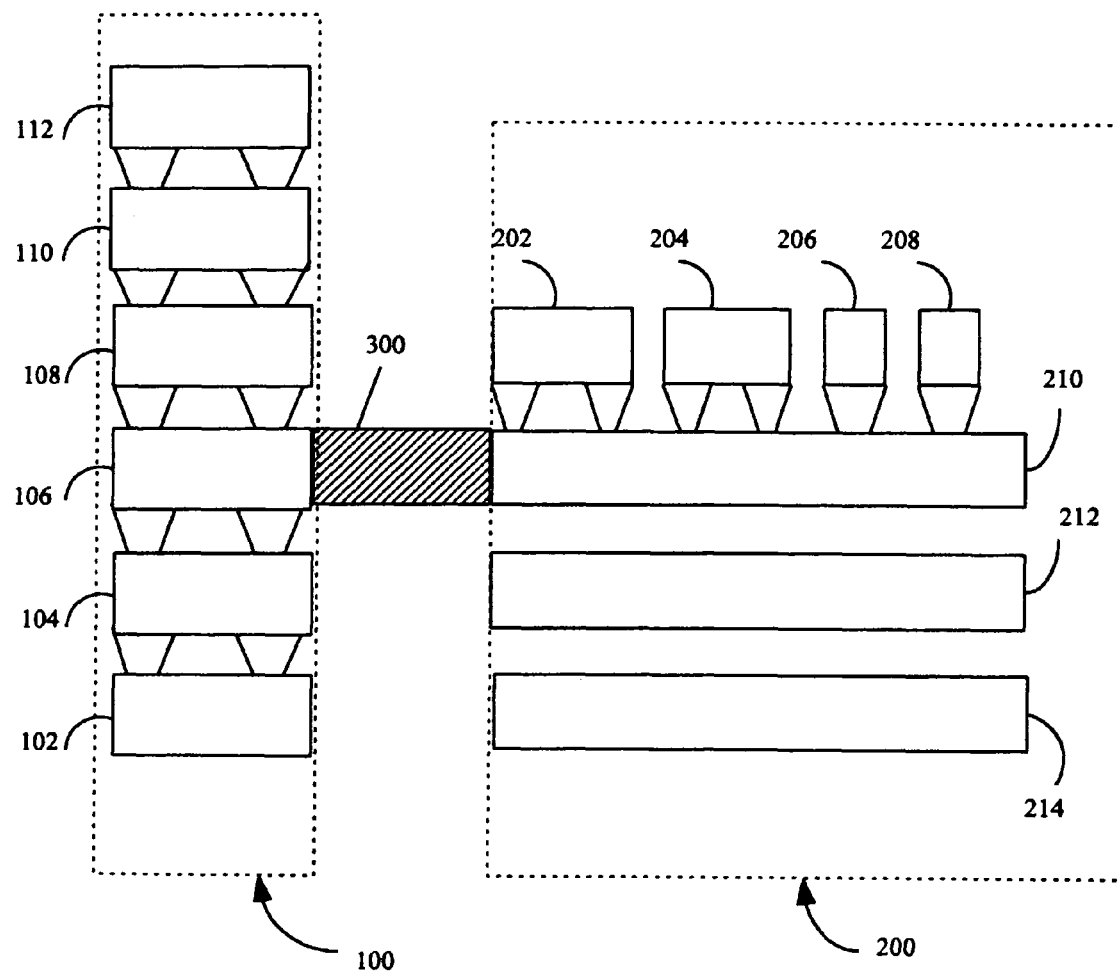
FIG. 4 is a schematic diagram of a bond pad comprised of a plurality of metal layers coupled to an input/output pin of an input/output device, thereby creating the function of a signal input/output connection.

In FIG. 1, the integrated circuit 400 is shown equipped with the universal bond pad system 100 for coupling with input/output devices 200. FIGS. 2 and 3 show an overhead schematic view of universal bond pads 100 coupled to input/output devices 200 via an interconnect structure 300. The interconnect structure 300 is making an input/output signal connection in the embodiments illustrated in FIGS. 2, 3, and 4. The interconnect structure is a pad wire in the embodiments illustrated. FIG. 4 shows a side view of the universal bond pad coupling to a slice 210 of the input/output device 200. The input/output device 200 is comprised of three slices in the embodiments illustrated: a first slice 214, a second slice 212, and the third slice 210. The slice 210 is equipped with an input/output ground supply pin 202, and input/output power supply pin 204, an input/output core power supply pin 206, and an input/output core ground supply pin 208.

Figure 5:
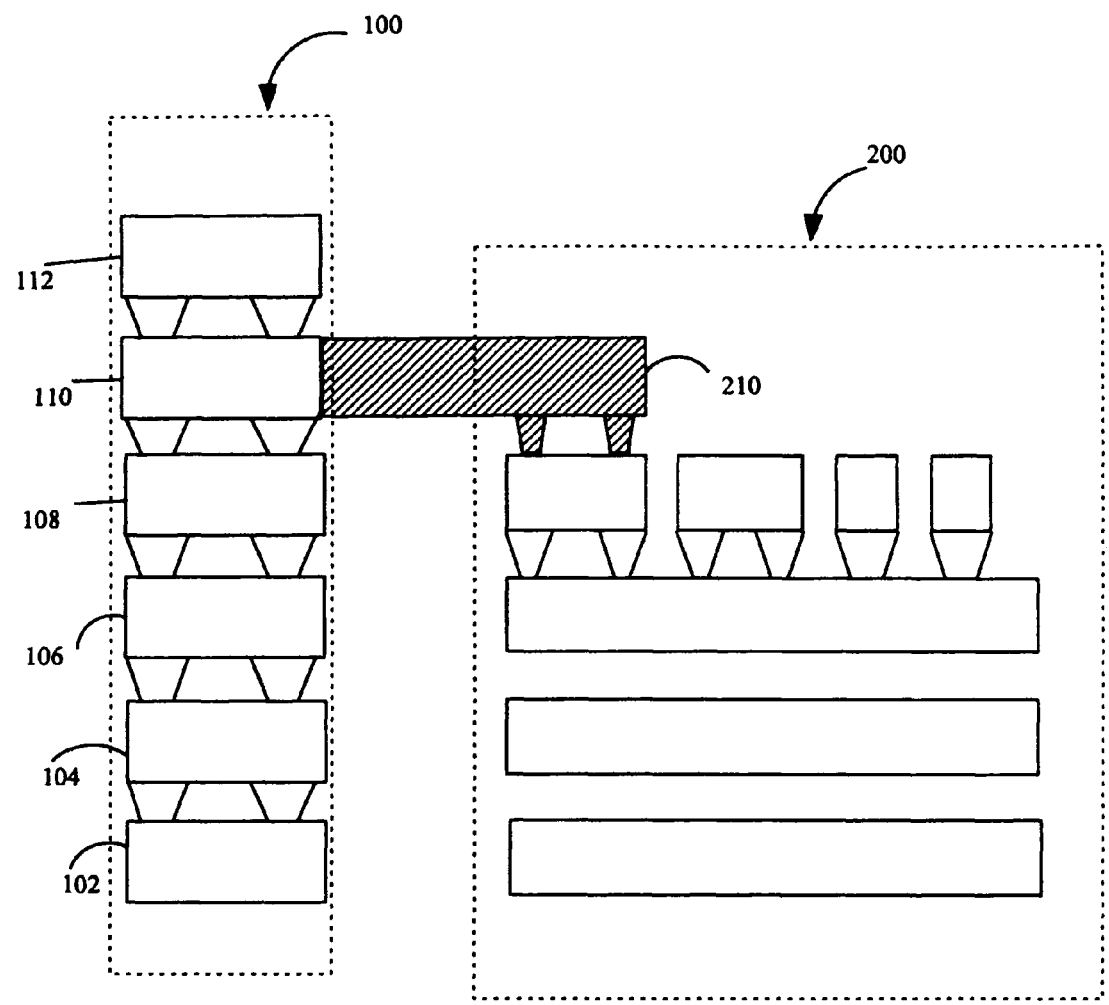
FIG. 5 is a schematic diagram of a bond pad comprised of a plurality of metal layers coupled to an input/output ground connection.
Figure 6:
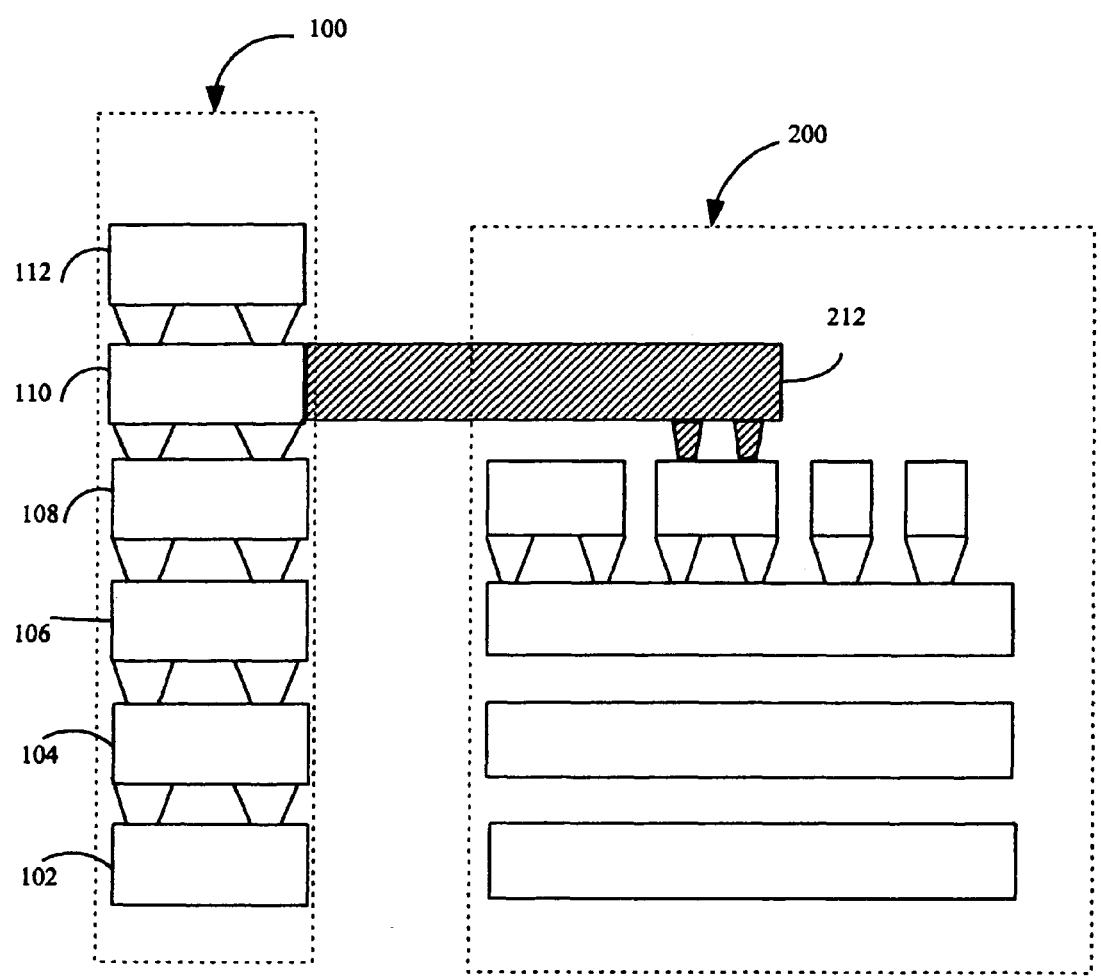
FIG. 6 is a schematic diagram of a bond pad comprised of a plurality of metal layers coupled to an input/output power connection.
Figure 7:
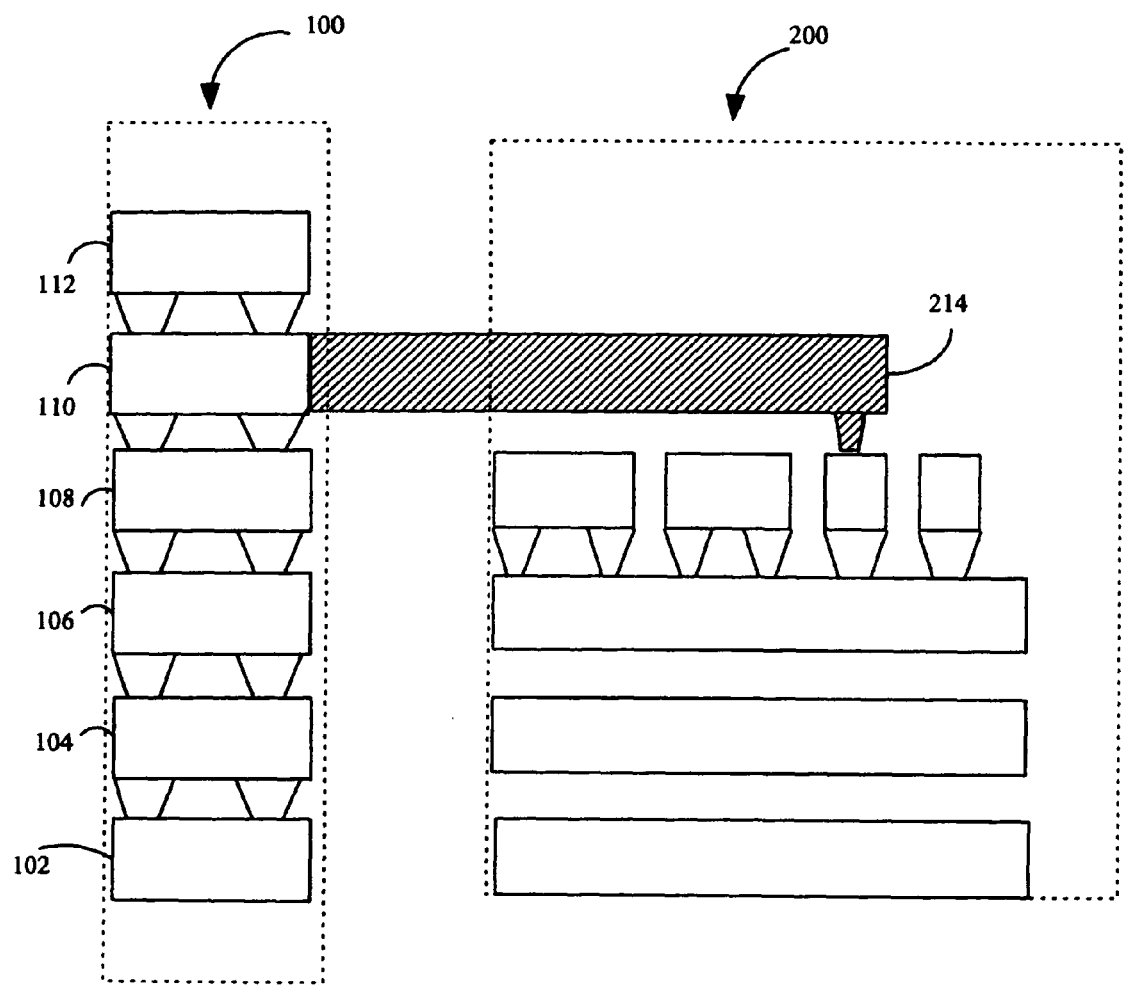
FIG. 7 is a schematic diagram of a bond pad comprised of a plurality of metal layers coupled to an input/output core power connection.
Figure 8:
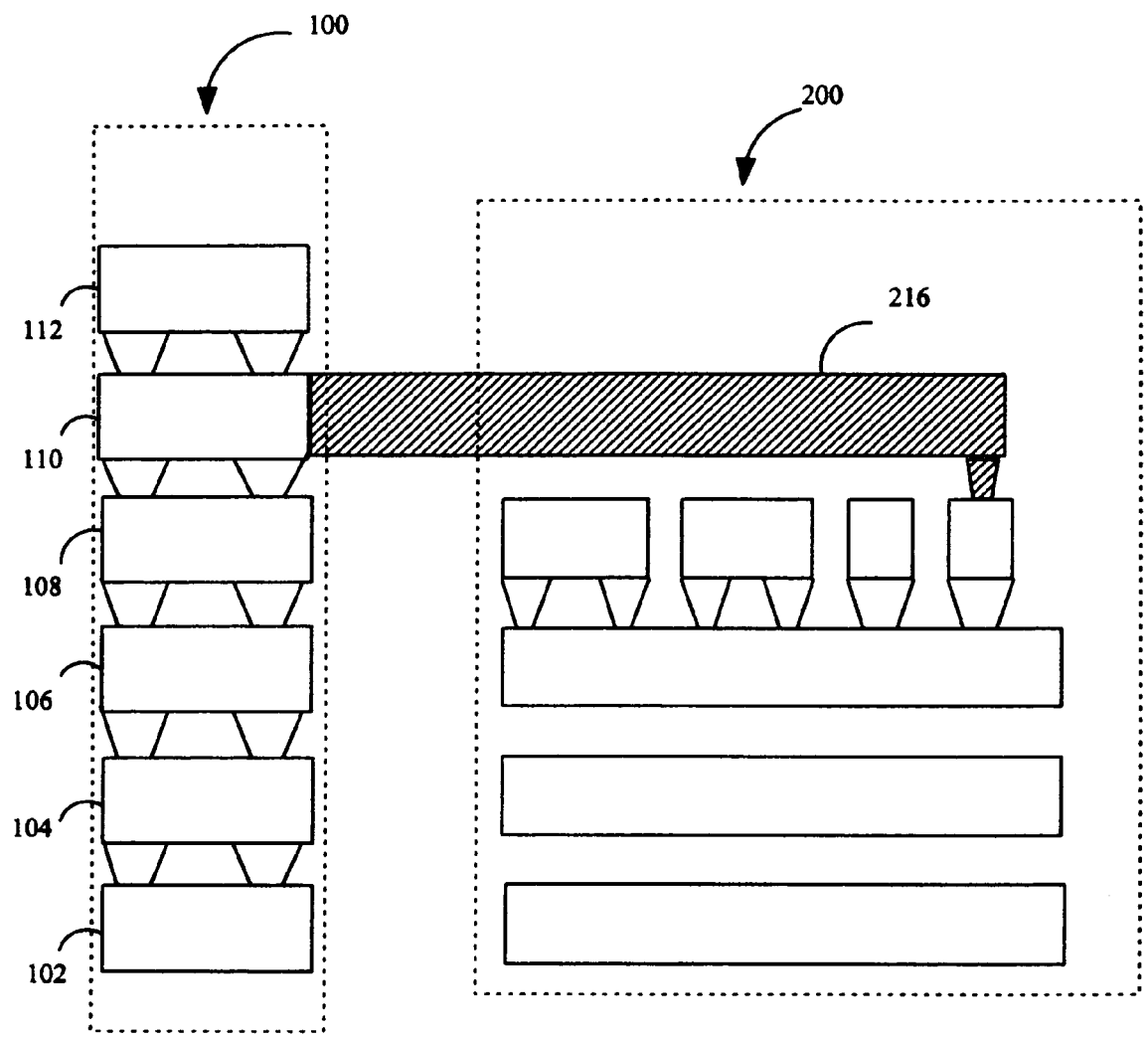
FIG. 8 is a schematic diagram of a bond pad comprised of a plurality of metal layers coupled to an input/output core ground connection.

In FIG. 5 the universal bond pad system 100 is shown providing an input/output ground supply connection to the input/output device 200. A customer configures the universal bond pad for making a ground supply connection at this location by coupling a pad wire 210 to metal layer 110 and the input/output ground supply pin 202. The same universal bond pad is capable of making a power supply connection at this location by coupling a pad wire 212 to the metal layer 110 and the input/output power supply pin 204. This connection is illustrated in FIG. 6. In FIG. 7 the universal bond pad is shown making a core power connection at this same location on the integrated circuit 400 by coupling a pad wire 214 to the input/output core power pin 206. In FIG. 8 the universal bond pad is shown making a core ground connection at this same location on the integrated circuit 400 by coupling a pad wire 216 to the input/output core ground pin 208.

Figure 9:
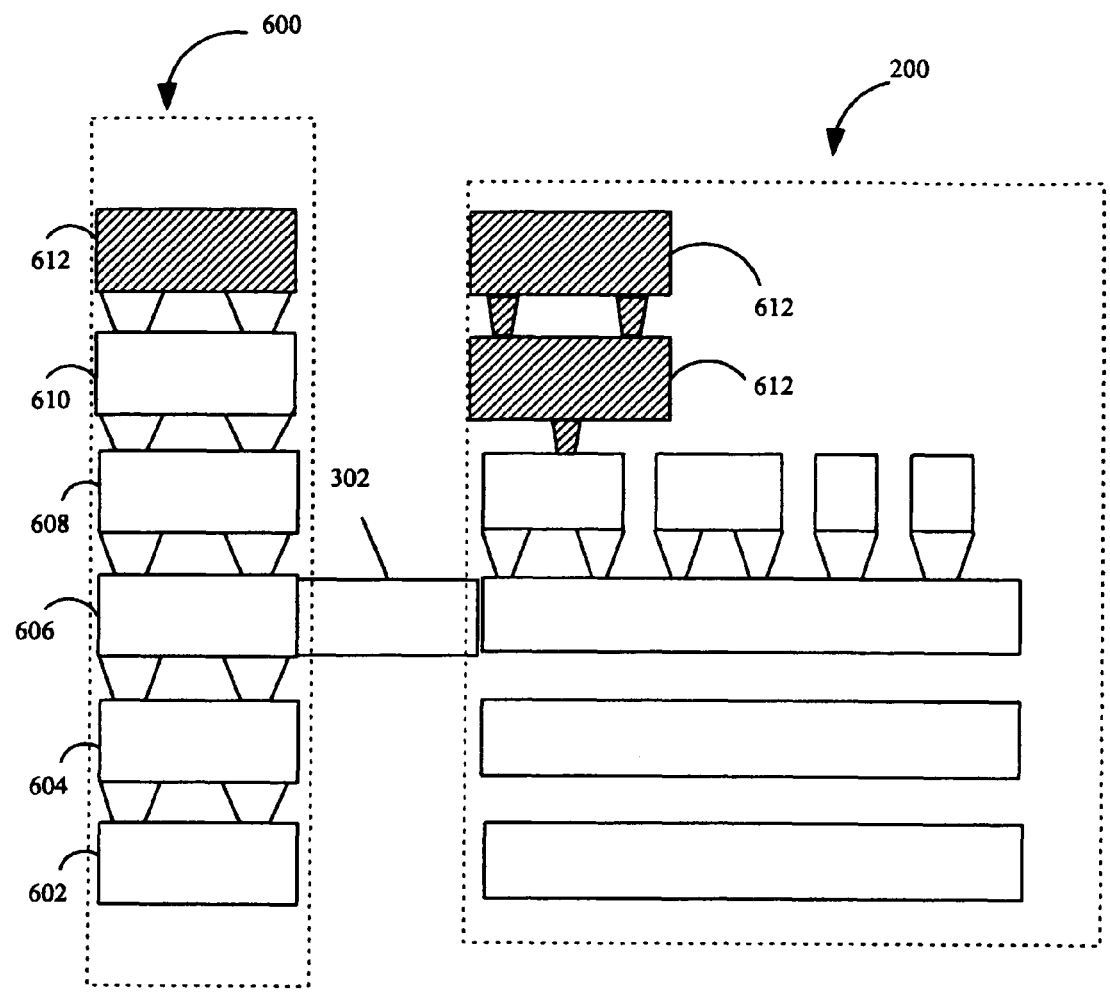
FIG. 9 is a schematic diagram of a bond pad comprised of a plurality of metal layers coupled to an input/output device with a pad structure for making an input/output ground connection in accordance with an exemplary embodiment of the present invention.
Figure 10:
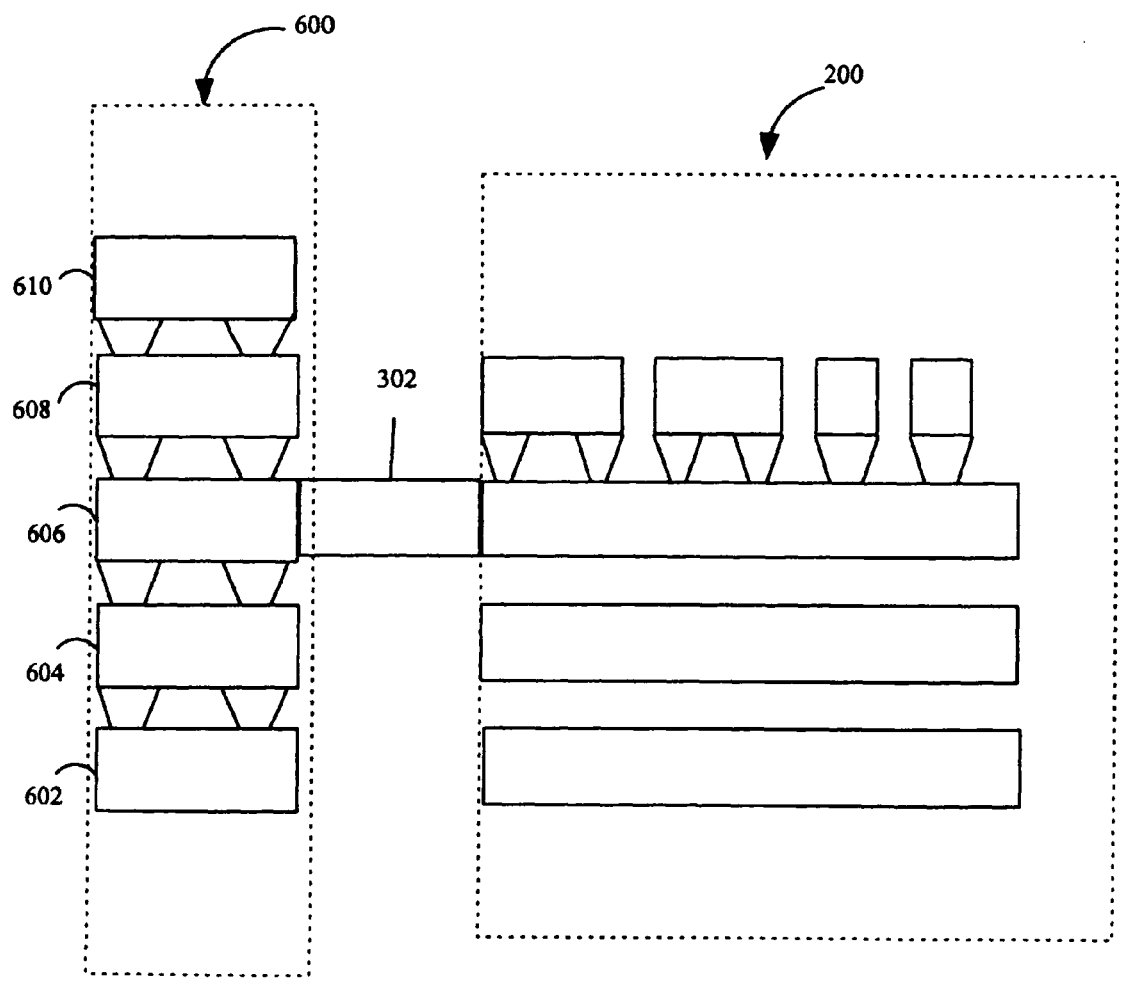
FIG. 10 is a schematic diagram of a bond pad comprised of a plurality of metal layers coupled to an input/output device with a configurable pad wire for making an input/output signal connection in accordance with an exemplary embodiment of the present invention.
Figure 11:
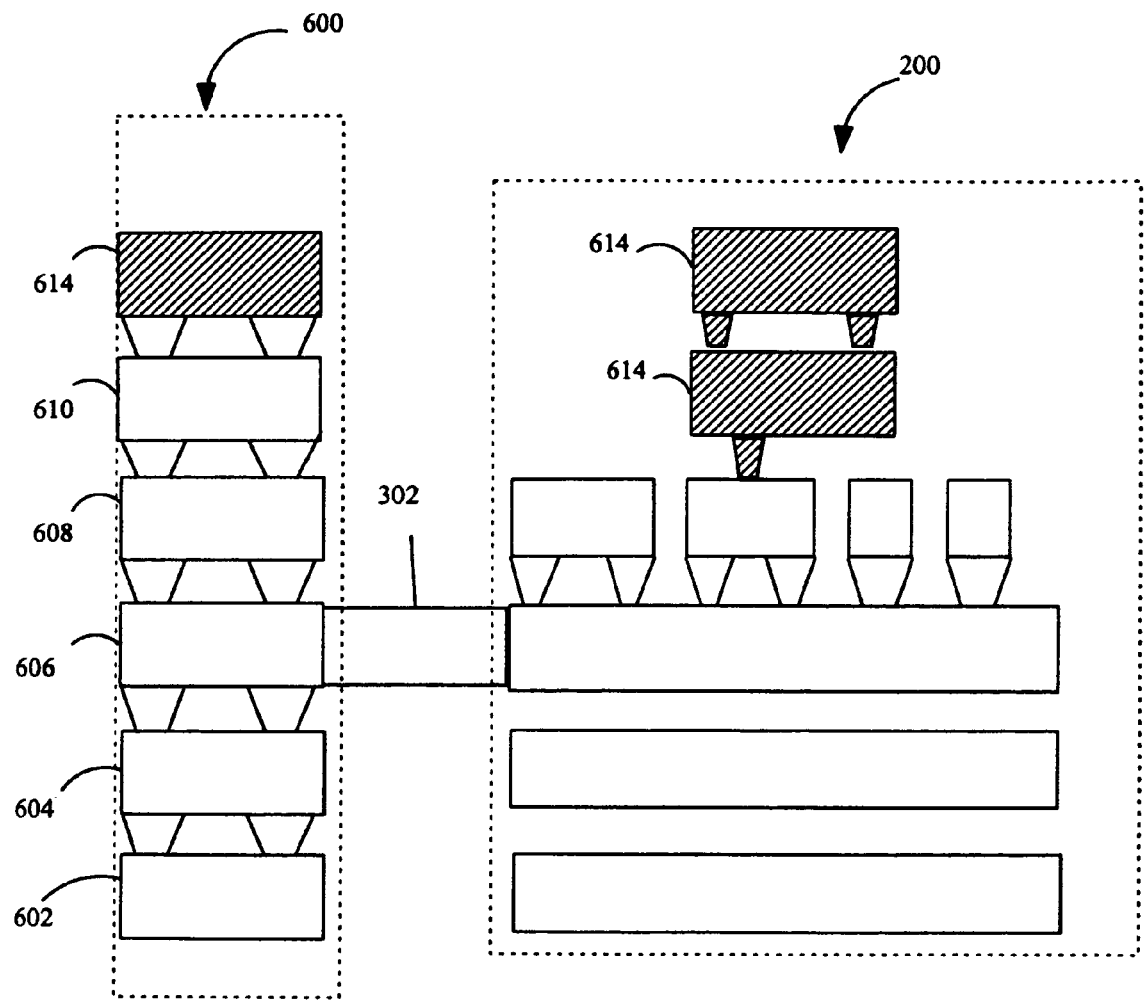
FIG. 11 is a schematic diagram of a bond pad comprised of a plurality of metal layers coupled to an input/output device with a pad structure for making an input/output ground connection in accordance with an exemplary embodiment of the present invention.

A universal bond pad system 600 is illustrated in FIGS. 9 through 11. The universal bond pad 600 is provided with a configurable pad wire 302 for coupling the bond pad with a signal pin of the input/output device 200, as is illustrated in FIG. 10. The configurable pad wire 302 is pre-designed as part of the pad cell structure. Different pad cell versions may then be swapped to build the required function. For instance, after slice creation a pad structure is selected from a plurality of pad structures. The plurality of pad structures includes a power supply pad structure 614 and a ground supply pad structure 612. The universal bond pad is coupled to the input/output device 200 with the pad structure. Multiple pads may be placed around or above the input/output device and connected to an input/output signal, power, or ground pin; only one of these pads is chosen during package assembly. The power supply pad structure 614 is selected if the customer has requested that the bond pad be coupled with a power supply pin of the input/output device 200, as is illustrated in FIG. 11. The ground supply pad structure 612 is selected if the customer has requested that the bond pad be coupled with a ground supply pin of the input/output device 200, as is illustrated in FIG. 9.

The embodiments illustrated in FIGS. 1 through 11 show the universal bond pad system implemented with a wirebond package. The integrated circuit may be a flipchip package in an alternative embodiment. A flip chip design replaces the bond pads 100 of the wirebond package 400 with an arrangement of flip chip bumps. Flipchip packages will work in a similar manner except the interconnect escaping from the flipchip bump will route to the appropriate input/output pin.

Figure 12:
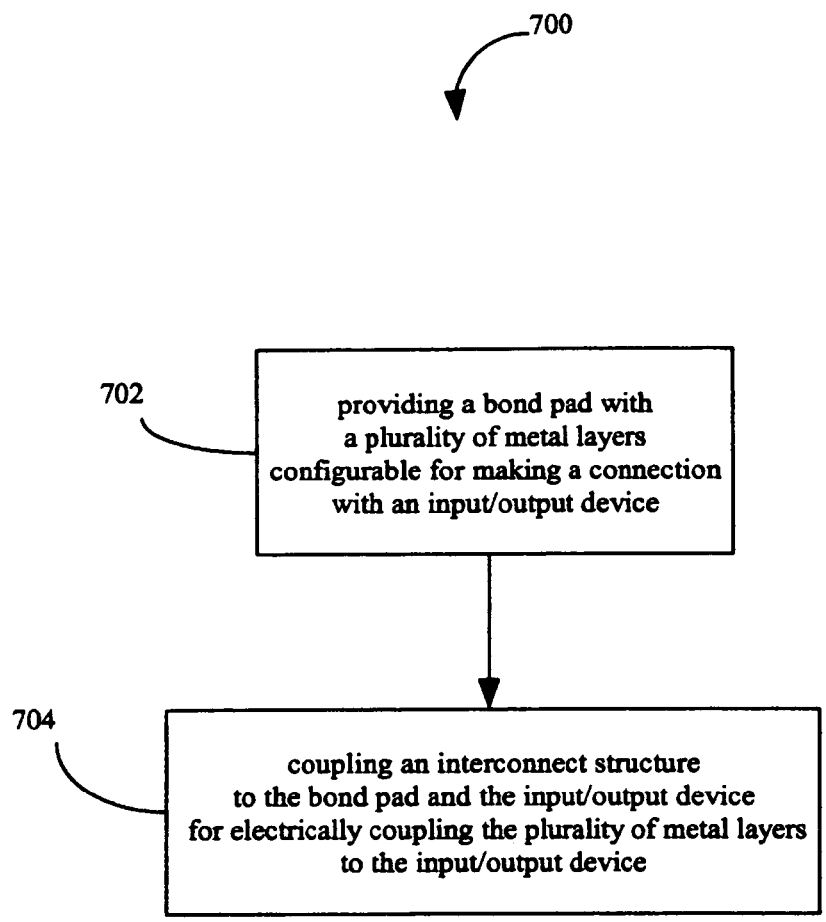
FIG. 12 is a block diagram illustrating a method for electrically coupling a bond pad to an input/output device in accordance with the present invention.

A method 700 for electrically coupling a bond pad of an integrated circuit to an input/output device is illustrated in FIG. 12. A first step 702 comprises providing the bond pad with a plurality of metal layers configurable for making a connection with the input/output device. The metal layers are capable of making any one of the following connections: an input/output power supply, an input/output ground supply, an input/output core power supply, or an input/output core ground supply. A second step 704 includes coupling an interconnect structure to the bond pad and the input/output device for electrically coupling the plurality of metal layers to the input/output device. The interconnect structure is a pad wire for wirebond packages or an interconnect escaping from a flipchip bump for flipchip packages. The method 700 for electrically coupling the bond pad to the input/output device allows the customer to configure the power and ground pad counts after a slice is created. Hence, input/output signal, power, ground, core power, and core ground counts can be tuned for the specific application, which enables the most optimal utilization of these resources.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A universal bond pad system for electrically coupling a bond pad of a configurable integrated circuit to an input/output device comprising:

an input/output device with at least one pin and at least one slice, the at least one pin including at least one of: an input/output power supply pin, an input/output core power supply pin, an input/output ground supply pin, and an input/output core ground supply pin, and the at least one slice including an input/output signal slice;

a bond pad with at least two layers; and an interconnect structure for electrically coupling at least one layer of the at least two layers to the input/output device, wherein the bond pad is configurable as at least two selected from the group of bond pad configurations consisting of: a power pad by being electrically coupleable via the interconnect structure to the input/output power supply pin of the at least one pin of the input/output device, a core power pad by being electrically coupleable via the interconnect structure to the input/output core power supply pin of the at least one pin of the input/output device, an input/output signal pad by being electrically coupleable via the interconnect structure to the input/output signal slice of the at least one slice of the input/output device, a ground pad by being electrically coupleable via the interconnect structure to the input/output ground supply pin of the at least one pin of the input/output device, or a core ground pad by being electrically coupleable via the interconnect structure to the input/output core ground supply pin of the at least one pin of the input/output device, wherein the bond pad configuration is determined by which pin of the at least one pin is electrically coupled to the bond pad and which slice of the at least one slice is electrically coupled to the input/output device.

2. The universal bond pad system as claimed in claim 1, wherein the interconnect structure transfers an input/output signal.

3. The universal bond pad system as claimed in claim 1, wherein the interconnect structure transfers an input/output power supply.

4. The universal bond pad system as claimed in claim 1, wherein the interconnect structure transfers an input/output ground supply.

5. The universal bond pad system as claimed in claim 1, wherein the interconnect structure transfers a core power supply.

6. The universal bond pad system as claimed in claim 1, wherein the interconnect structure transfers a core ground supply.

7. The universal bond pad system as claimed in claim 1, wherein the interconnect structure is a pad wire.

8. The universal bond pad system as claimed in claim 1, wherein the interconnect structure is a flip chip bump.

9. A universal bond pad system, comprising:

a bond pad with at least two layers;

an input/output device with at least two pins and at least one slice, the at least two pins including at least two of: an input/output power supply pin, an input/output core power supply pin, an input/output ground supply pin, and an input/output core ground supply pin, and the at least one slice including an input/output signal slice;

a pad structure assembly for electrically coupling a layer of the at least two layers to the input/output device, wherein the bond pad is configurable as at least three selected from the group of bond pad configurations consisting of: a power pad by being electrically coupled to the input/output power supply pin of the at least two pins of the input/output device via the pad structure, a core power pad by being electrically coupled to the input/output core power supply pin of the at least two pins of the input/output device via the pad structure, an input/output signal pad by being electrically coupled to the input/output signal slice of the at least one slice of the input/output device via the pad structure, a ground pad by being electrically coupled to the input/output ground supply pin of the at least two pins of the input/output device via the pad structure, or a core ground pad by being electrically coupled to the input/output core ground supply pin of the at least two pins of the input/output device via the pad structure, wherein the bond pad configuration is determined by which pin of the at least two pins is electrically coupled to the bond pad and which slice of the at least one slice is electrically coupled to the input/output device, wherein each pin of the at least two pins is a different horizontal distance from the bond pad.

10. The universal bond pad system as claimed in claim 9, further comprising a pad wire for coupling said layer of the at least two layers to said input/output signal pin of the input/output device.

11. The universal bond pad system as claimed in claim 9, wherein the pad structure assembly includes a pad structure for transferring one selected from an input/output power supply and an input/output ground supply.

12. The universal bond pad system as claimed in claim 9, wherein the pad structure assembly includes a pad structure for transferring an input/output core power supply and a pad structure for transferring an input/output core ground supply.

* * * * *